(12) United States Patent
Lim et al.

(10) Patent No.: US 9,671,658 B2
(45) Date of Patent: Jun. 6, 2017

(54) LIQUID CRYSTAL DISPLAY

(71) Applicant: SAMSUNG DISPLAY CO., LTD., Yongin-si, Gyeonggi-Do (KR)

(72) Inventors: Sung-Hoon Lim, Gunsan-si (KR); Man Hong Na, Seoul (KR); Young-Je Cho, Asan-si (KR); Sung-Man Kim, Seoul (KR); Min-Chul Song, Seoul (KR); Soo Jung Chae, Seoul (KR); Eu Gene Lee, Busan (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 69 days.

(21) Appl. No.: 14/956,625

(22) Filed: Dec. 2, 2015

(65) Prior Publication Data

US 2016/0085106 A1   Mar. 24, 2016

Related U.S. Application Data

(63) Continuation of application No. 14/451,775, filed on Aug. 5, 2014, now Pat. No. 9,218,790, which is a
(Continued)

(30) Foreign Application Priority Data

Sep. 22, 2011 (KR) .......................... 10-2011-0095747

(51) Int. Cl.
*G02F 1/1345* (2006.01)
*G09G 3/36* (2006.01)
(Continued)

(52) U.S. Cl.
CPC ........ *G02F 1/13454* (2013.01); *G02F 1/1339* (2013.01); *G02F 1/1345* (2013.01);
(Continued)

(58) Field of Classification Search
CPC . G02F 1/13454; G02F 1/1339; G09G 3/3688; G09G 3/3696; G09G 2300/08; G09G 2300/0408
See application file for complete search history.

(56) References Cited

U.S. PATENT DOCUMENTS 6,704,072 B2 * 3/2004 Jeong .................... G02F 1/1339
345/82
7,405,716 B2 * 7/2008 Lee ....................... G09G 3/3648
345/204
(Continued)

FOREIGN PATENT DOCUMENTS

| JP | 2006-039562 | 2/2006 |
|---|---|---|
| JP | 2009-223051 | 10/2009 |

(Continued)

*Primary Examiner* — Andrew Sasinowski
(74) *Attorney, Agent, or Firm* — F. Chau & Associates, LLC

(57) ABSTRACT

A liquid crystal display includes a substrate, a plurality of signal lines, a gate driver, and a sealant. The substrate includes a display area and a peripheral area outside the display area. The signal lines are integrated with the substrate and include a clock signal line. The gate driver includes a stage located between the clock signal line and the display area. The stage is integrated with the substrate and is configured to apply a gate voltage to the display area. The sealant is distributed over part of the peripheral area. A seal region where the sealant is distributed includes a seal line, and the clock signal line is located within the seal line. The clock signal line is located further away from the stage than the other signal lines.

24 Claims, 6 Drawing Sheets

Related U.S. Application Data continuation of application No. 13/422,109, filed on Mar. 16, 2012, now Pat. No. 8,803,865.

(51) Int. Cl.
  *G02F 1/1339* (2006.01)
  *H01L 21/77* (2017.01)
  *G09G 5/18* (2006.01)

(52) U.S. Cl.
  CPC ......... *G09G 3/3688* (2013.01); *G09G 3/3696* (2013.01); *G09G 5/18* (2013.01); *H01L 21/77* (2013.01); *G09G 2300/0408* (2013.01); *G09G 2300/08* (2013.01)

(56) References Cited

U.S. PATENT DOCUMENTS

| | | | |
|---|---|---|---|
| 7,538,848 B2 | 5/2009 | Park et al. | |
| 9,261,741 B2* | 2/2016 | Yoshida | G02F 1/1339 |
| 2005/0264507 A1 | 12/2005 | Jang et al. | |
| 2009/0189839 A1 | 7/2009 | Ko et al. | |
| 2009/0296038 A1 | 12/2009 | Yoon et al. | |
| 2010/0163879 A1* | 7/2010 | Jung | G02F 1/13454 257/59 |
| 2011/0074705 A1 | 3/2011 | Yousefpor et al. | |

FOREIGN PATENT DOCUMENTS

| | | |
|---|---|---|
| JP | 2010-186537 | 8/2010 |
| KR | 1020060085450 | 7/2006 |
| KR | 1020070073020 | 7/2007 |
| KR | 1020090114767 | 11/2009 |

\* cited by examiner

LIQUID CRYSTAL DISPLAY

CROSS-REFERENCE TO RELATED APPLICATION

This application is a continuation of co-pending U.S. patent application Ser. No. 14/451,775 filed Aug. 5, 2015, which is a continuation application of U.S. application Ser. No. 13/422,109 filed Mar. 16, 2012, which issued as U.S. Pat. No. 8,803,865 on Aug. 12, 2014, which claims priority to Korean Patent Application No. 10-2011-0095747, filed in the Korean Intellectual Property Office on Sep. 22, 2011, the disclosures of which are each hereby incorporated by reference herein in their entireties.

TECHNICAL FIELD

Embodiments of the invention are directed to liquid crystal displays.

DISCUSSION OF RELATED ART

A liquid crystal display (LCD) includes two display panels in which field generating electrodes such as a pixel electrode and a common electrode are formed, and a liquid crystal (LC) layer disposed therebetween. The LCD displays images by applying voltages to the field-generating electrodes to generate an electric field in the LC layer that determines the orientation of LC molecules therein to adjust polarization of incident light. A gate driver and signal lines may be integrated into a display panel in a peripheral area outside a display area of the liquid crystal display using a sealant.

A plurality of display devices may be connected to each other to form a stereoscopic image display device for displaying a three-dimensional 3D image. However, the presence of the bezel on each the connected displays may reduce the overall image quality. Accordingly, the width of the bezels can be narrowed to increase image quality.

However, when the bezel is narrowed excessively, display quality may deteriorate due to the interference generated by the gate driver, the signal line, and the sealant.

SUMMARY OF THE INVENTION

A liquid crystal display according to an exemplary embodiment of the present invention includes a substrate, a plurality of signal lines, a gate driver, and a sealant. The substrate includes a display area and a peripheral area outside the display area. The signal lines are integrated with the substrate. The signal lines include a clock signal line. The gate driver includes a stage located between the clock signal line and the display area. The stage is integrated with the substrate and is configured to apply a gate voltage to the display area. The sealant is distributed over part of the peripheral area. A seal region where the sealant is distributed includes a seal line, and the clock signal line is disposed within the seal line. The clock signal line is located further away from the stage than the other signal lines.

A width of the clock signal line may be less than or substantially equal to a width of the seal line.

The signal lines may include a voltage signal line located between the clock signal line and the stage. The clock signal line may be located between an edge glass region located at an outermost edge of the substrate and the voltage signal line. The voltage signal line may include at least one of a signal line applying a common voltage, a signal line applying a gate-off voltage, or a signal line applying a storage voltage.

The gate driver may be located in at least one of an upper side region, a lower side region, a left side region, or a right side region of the peripheral area relative to the display area.

The clock signal line may be located in at least one of the upper side region, the lower side region, the left side region, or the right side region corresponding to a position of the gate driver.

The clock signal line may include a first clock signal line and a second clock signal line separated from each other. A clock signal line region occupied by the first clock signal line and the second clock signal line occupy may be located within the seal line. A width of the clock signal line region may be less than or substantially equal to a width of the seal line. The width of the clock signal line region may be substantially the same as a sum of a width of the first clock signal line, a width of the second clock signal line, and a distance that the first clock signal line and the second clock signal line are separated from each other. A width of the seal region may be about 700 μm ±about 200 μm. A width of the seal line may be less than about 300 μm.

The stage may include an input section, a pull-up driver, a pull-down driver, an output unit, and a transmission signal generator. The input section, the pull-down driver, the output unit, and the transmission signal generator may be connected to a same first node. The pull-up driver and the pull-down driver may be connected to a same second node.

A liquid crystal display according to an exemplary embodiment of the invention includes a substrate, a gate driver, a voltage signal line, a clock signal line, and sealant. The substrate includes a display area and a non-display area outside the display area. The display area includes a plurality of pixels. The gate driver comprises a stage located in the non-display area adjacent the display area. The gate driver is configured to apply a gate voltage to the pixels. The voltage signal line is located between the stage and an outer edge of the substrate. The voltage signal line is configured to transmit a constant voltage to the stage. The clock signal line is located between the voltage signal line and the outer edge. The clock signal line is configured to transmit a voltage that transitions between different logic levels to the stage. The sealant entirely overlaps the clock signal line without overlapping the stage. The voltage signal line may include a first signal line that transmits a gate-off voltage and a second signal line that transmits a common voltage for a common electrode of an opposing substrate of the display.

A liquid crystal display according to an exemplary embodiment of the invention includes a substrate, a gate driver, and a plurality of signal lines. The substrate includes a display area and a non-display area outside the display area. The display area includes a plurality of pixels, a plurality of gate lines in a first direction, and a plurality of data lines in a second other direction. The gate driver includes a stage located in the non-display area adjacent the display area. The gate driver is configured to apply a gate voltage to one of the gate lines. The signal lines are integrated with the substrate and arranged in the second direction. Each signal line is connected to the gate driver via a line arranged in the first direction. A clock signal line of the signal lines is further away from the stage than the other signal lines and a sealant entirely overlaps the clock signal line without overlapping the stage.

DETAILED DESCRIPTION

Figure 1:
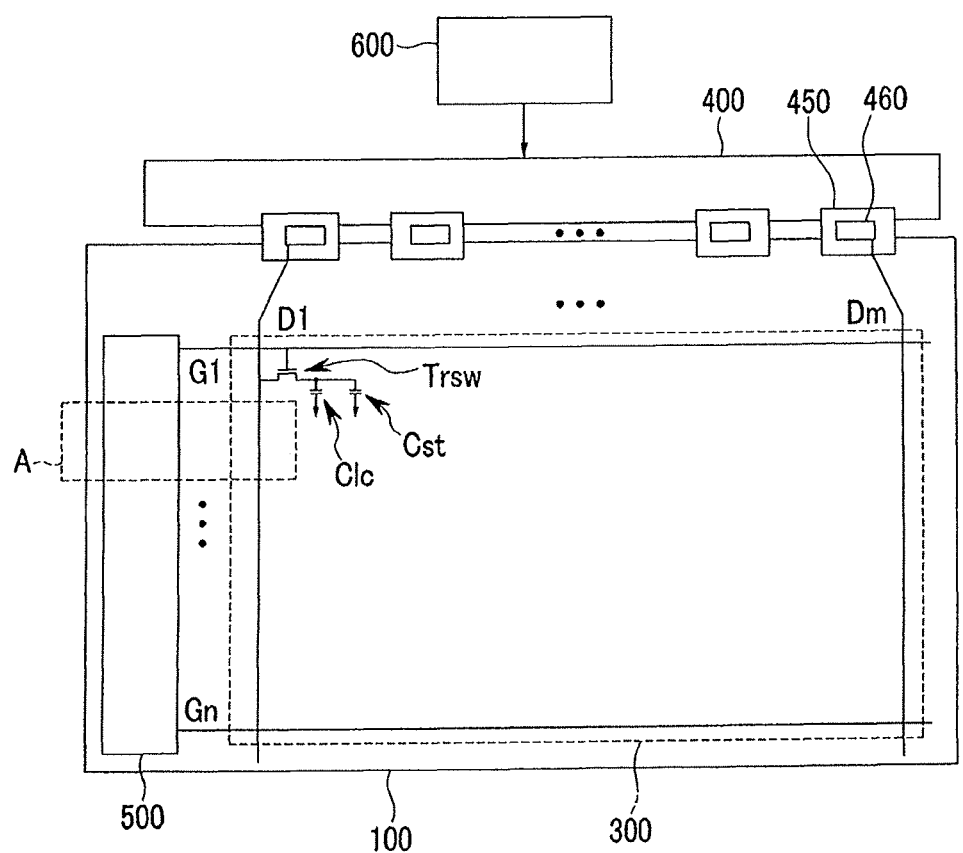
FIG. 1 is a schematic view of a liquid crystal display according to an exemplary embodiment of the present invention.

The present invention will be described more fully hereinafter with reference to the accompanying drawings, in which exemplary embodiments thereof are shown. The described embodiments may be modified in various different ways, without departing from the spirit or scope of the present invention. In the drawings, like reference numerals may designate like elements throughout the specification.

In the drawings, the thickness of layers, films, panels, regions, etc. may be exaggerated for clarity. It will be understood that when an element such as a layer, film, region, or substrate is referred to as being "on" another element, it can be directly on the other element or intervening elements may also be present. It will be understood that when an element such as a layer, film, region, or substrate is referred to as being "beneath" another element, it can be directly beneath the other element or intervening elements may also be present.

As used herein, the singular forms, "a," "an" and "the" are intended to include the plural forms as well, unless the context clearly indicates otherwise.

FIG. 1 is a schematic view of a liquid crystal display according to an exemplary embodiment of the present invention.

Referring to FIG. 1, a liquid crystal panel 100 according to an exemplary embodiment of the present invention includes a display area 300 displaying an image, a gate driver 500 applying a gate voltage to gate lines G1-Gn, and at least one data driver IC 460 applying a data voltage to data lines D1-Dm. In an embodiment, the liquid crystal panel 100 is one substrate and a common electrode is located on an opposing substrate. The data driver IC 460 is located on a flexible printed circuit (FPC) film 450 attached to the display panel 100 and a flexible printed circuit film 450. The gate driver 500 and the data driver IC 460 are controlled by a signal controller 600. A printed circuit board (PCB) 400 is formed outside the flexible printed circuit film 450 and transmits signals from the signal controller 600 to the data driver IC 460 and the gate driver 500. The signals provided from the signal controller 600 may include signals such as a clock signal, a scan start signal, and a signal providing a voltage of a predetermined level. The signals may be respectively transmitted through signal lines. As an example, the clock signal may be used to control an output period of a gate-on and a gate-off voltage applied to a gate line. As an example, the scan start signal may instruct that a scanning of the gate lines G1-Gn is to begin. As an example, the signal providing a voltage of a predetermined level may provide the voltage levels of the gate-on and gate-off voltages. The gate driver 500 and the signal lines may be integrated with the liquid crystal panel 100.

In the liquid crystal panel 100, the display area 300 may include one or more pixels, where each includes a thin film transistor Trsw, a liquid crystal capacitor Clc, and a storage capacitor Cst. In the liquid crystal panel 100, an area outside (e.g., surrounding) the display area 300 may be referred to as a peripheral area. A sealant is disposed in the peripheral area.

The display area 300 includes at least one of the pixels, and parts of the gate lines G1-Gn and the data lines D1-Dm. The gate lines G1-Gn and the data lines D1-Dm may be insulated from each other. The gate lines G1-Gn and the data lines D1-DM intersect each other.

As discussed above, in an embodiment, a pixel includes the thin film transistor Trsw, the liquid crystal capacitor Clc, and the storage capacitor Cst. However, in an alternate embodiment of the pixel, the storage capacitor Cst is omitted. The thin film transistor Trsw includes a control terminal (e.g., a gate terminal) connected to a gate line, an input terminal connected to a data line, and an output terminal connected to one terminal of the liquid crystal capacitor Clc and one terminal of the storage capacitor Cst. The other terminal of the liquid crystal capacitor Clc is connected to the common electrode, and the other terminal of the storage capacitor Cst receives a storage voltage Vcst applied from the signal controller 600.

The data lines D1-Dm receive data voltages from one data driver IC 460 or from multiple data driver ICs 460, and the gate lines G1-Gn receives the gate voltage from the gate driver 500. In an embodiment, a single data driver IC 460 supplies all the data lines D1-Dm with data voltages. In an embodiment, one data driver IC 460 supplies part of the data lines (e.g., 1 or more) with some of the data voltages and one or more other data driver ICs 460 supply a remaining part or other part of the data lines (e.g., 1 or more) with their data voltages. The number of data driver ICs 460 and the number of data lines which they supply may vary based on the application.

A data driver IC 460 may be disposed at an upper side or a lower side of the display panel 100. The data driver IC 460 is connected to the data lines D1-Dm. At least a portion of the data lines D1-Dm may extend in a column direction.

The gate driver 500 receives at least one of the scan start signal, one or more clock signals, or one or more voltage signals to generate a gate voltage (e.g., a gate-on and gate-off voltage). In an embodiment, the gate driver 500 sequentially applies the gate-on voltage to the gate lines G1-Gn. In an embodiment, the voltage signal received by the gate driver 500 is a gate-off voltage, a voltage lower than the gate-off voltage, a common voltage, or a storage voltage. The gate voltage may include the gate-on voltage and the gate-off voltage.

The clock signal, the scan start signal, and the voltage signal applied to the gate driver 500 are transmitted across the peripheral area of the display panel 100. The clock signal, the scan start signal, and the voltage signal may be transmitted to the flexible printed circuit film 450 from an external source or from the signal controller 600 through the printed circuit board (PCB) 400.

Figure 2:
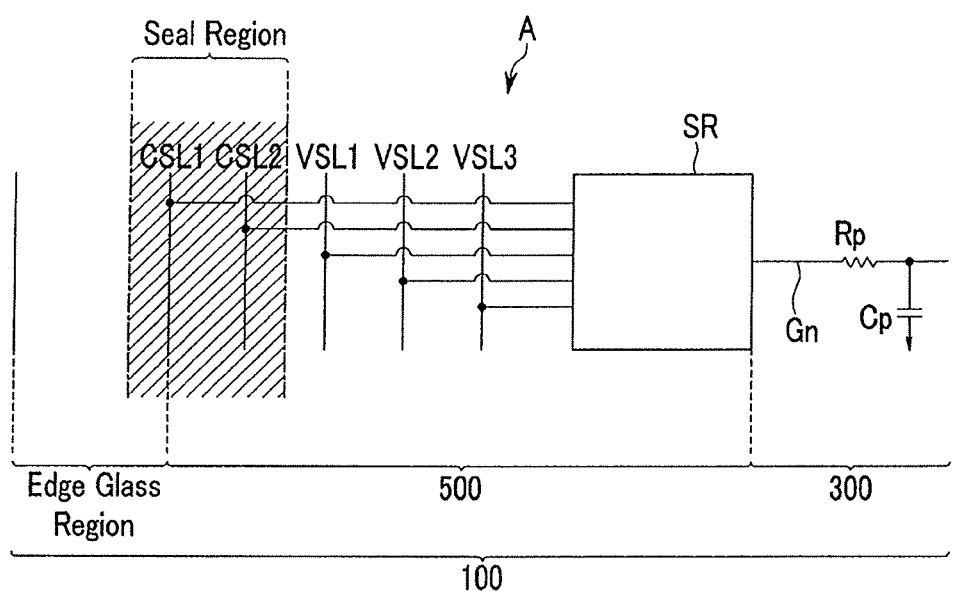
FIG. 2 is an enlarged view of a portion A of the liquid crystal display of FIG. 1 according to an exemplary embodiment of the present invention.
Figure 3:
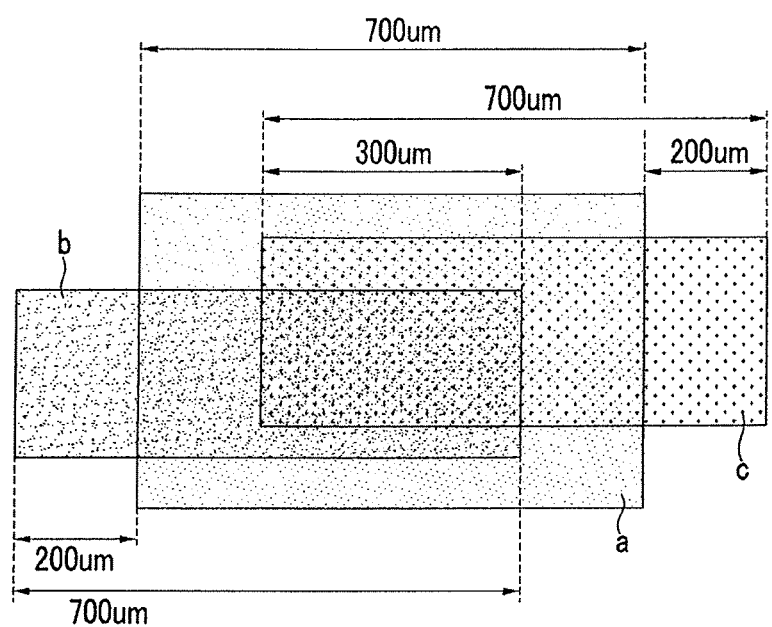
FIG. 3 is an exemplary view of a distribution region of a sealant.

FIG. 2 is an enlarged view of a portion A of the liquid crystal display of FIG. 1, and FIG. 3 is an exemplary view of a distribution region of a sealant.

Referring to FIG. 2, the display area 300 includes a resistor Rp and a capacitor Cp. The gate lines G1-Gn, the liquid crystal capacitor Clc, and the storage capacitor Cst may be represented by the resistor Rp and the capacitor Cp. A gate voltage output from a stage SR of a gate driver 500 is transmitted through the gate lines G1-Gn. The gate driver 500 may include a plurality of stages that are dependently connected to each other. For example, an output of current one of the stages may depend on an output of a prior one of the stages. For example, the output of a prior stage may be fed to an input of a subsequent stage. The gate driver 500 may include a dummy stage. The gate voltage output from a normal stage (e.g., a stage other than the dummy stage) is transmitted to a gate line and a data voltage is applied to a pixel to display an image. In an embodiment, the dummy stage is not connected to the gate line. In an embodiment, the dummy stage is connected to a gate line of a dummy pixel that does not display an image. In an embodiment, the gate driver 500 includes first and second clock signal lines CSL1 and CSL2 and first through third voltage signal lines VSL1, VSL2, and VSL3. However, in other embodiments, the gate driver 500 may include a different number of clock signal lines and voltage signal lines.

In an embodiment, the clock signal lines CSL1 and CSL2 and the voltage signal signals VSL1, VSL2, and VSL3 are arranged in a same first direction as the data lines. The stage SR is connected to the clock signal lines CSL1 and CSL2, and the voltage signal lines VSL1, VSL2, and VSL3. In an embodiment, the clock signal lines CSL1 and CSL2 and the voltage signal lines VSL1, VSL2, and VSL3 are connected to the stage via lines that are in a same second direction as the gate lines. The clock signal lines CSL1 and CSL2 may include timing wiring (for a timing signal) to drive the gate driver 500. For example, the clock signal lines CSL1 and CSL2 may provide clock waveforms that periodically toggle or transition from one logic level to another. In an embodiment, the clock waveform output by the first clock signal line CSL1 is out of phase with the clock signal waveform output by the second clock signal line CSL2. One or more clock signal lines may be provided, for example, there may be two, four, six, or eight clock signal lines. The voltage signal lines VSL1, VSL2, and VSL3 include signal lines transmitting voltages of predetermined levels. For example, the voltages transmitted by the voltage signal lines VSL1, VSL2, and VSL3 may be voltages of a constant level. The voltage signal lines VSL1, VSL2, and VSL3 may be signal lines transmitting the gate-off voltage, the common voltage, the storage voltage, or the like. There may be at least one voltage signal line; for example, there may be one, two, three, four, or more voltage signal lines.

In an embodiment, signal lines including the clock signal lines CSL1 and CSL2 and the voltage signal lines VSL1, VSL2, and VSL3 are integrated with the liquid crystal panel 100. The clock signal lines CSL1 and CSL2 are located further away from the stage SR than the other signal lines. In an embodiment, the clock signal lines CSL1 and CSL2 are located between an edge glass region disposed at an outermost edge of the liquid crystal panel 100 and the voltage signal lines VSL1, VSL2, and VSL3. In an embodiment, the voltage signal lines VSL1, VSL2, and VSL3 and the stage SR are disposed between the clock signal lines CSL1 and CSL2 and the display area 300. The clock signal lines CSL1 and CSL2 are located a distance away from the display area 300 that may prevent coupling of a pixel due to interference between the clock signal lines CSL1 and CSL2 and the display area 300 and reduce an output deviation of the stage SR, thereby improving the display quality.

In an embodiment, the clock signal lines CSL1 and CSL2 are located at or near a center of a seal region, and a region where the clock signal lines CSL1 and CSL2 are separated from each other is located within the seal region. Thus, the clock signal lines CSL1 and CSL2 are entirely overlapped by the seal region. Accordingly, distortion of clock signal waveforms caused by interference between the clock signal lines CSL1 and CSL2 and the sealant may be prevented, and a narrow bezel may be designed without increasing the size of the liquid crystal panel 100. However, when the clock signal lines CSL1 and CSL2 partially overlap with the seal region, a distortion may be generated in a clock signal waveform output by the clock signal lines CSL1 and CSL2. The distortion may be caused by interference between the clock signal lines CSL1 and CLS2 and the sealant. The distortion of the clock signal waveform may directly affect the output of a gate line such that deterioration such as a transverse stain may be generated.

In an embodiment, when the seal region also does not overlap the stage SR, an output deviation of the stage SR that may be caused by interference between the sealant and the stage SR may be avoided, and a reduction in an aperture ratio of a pattern for exposure of ultraviolet rays may be avoided. However, when the seal region partially overlaps the stage, an output deviation of the stage SR may be generated by the interference between the sealant and the stage SR, and the aperture ratio of the pattern may decrease such that a deterioration in the non-hardened sealant results.

Referring to FIG. 3, portions of the sealants a, b, and c distributed in the liquid crystal panel 100 are illustrated, and the portions of the sealants a, b, and c form the seal region. For example, when the seal region is maintained to be about 700 μm ±about 200 μm, an effective width of the seal line may be about 300 μm, and the clock signal lines CSL1 and CSL2 may be located within the width of the seal line. The width of the sealant may be changed based on the type of the sealant used. For example, width of the sealant may be larger than about 700 μm according to the type of the sealant used. In an embodiment, the width of the sealant is about 1600 μm. A region from the left boundary of the first clock signal line CSL1 located at the left side to the right boundary of the second clock signal line CSL2 located at the right side may be located within the seal line, and the distance from the left boundary of the first clock signal line CSL1 located at the left side to the right boundary of the second clock signal line CSL2 at the right side may be less than about 300 μm. The seal region is a region where the sealants are distributed, and the seal line is disposed within the seal region. When the width of the seal region is about 700 μm ±about 200 μm, when the effective width of the seal line is larger than about 300 μm, the cost of manufacturing a display may be excessive and design of a narrow bezel may be more difficult.

A region where a plurality of clock signal lines CSL1 and CSL2 are separated from each other may be referred to as a clock signal line region. The width of the clock signal line region may be less than or substantially equal to the width of the seal line, and the clock signal line region may be located within the seal line. The width of the region where a plurality of clock signal lines CSL1 and CSL2 are located corresponds to the distance from the left boundary of the clock signal line located at the leftmost side among a plurality of clock signal lines to the right boundary of the clock signal line located at the rightmost side among a plurality of clock signal lines.

Figure 4:
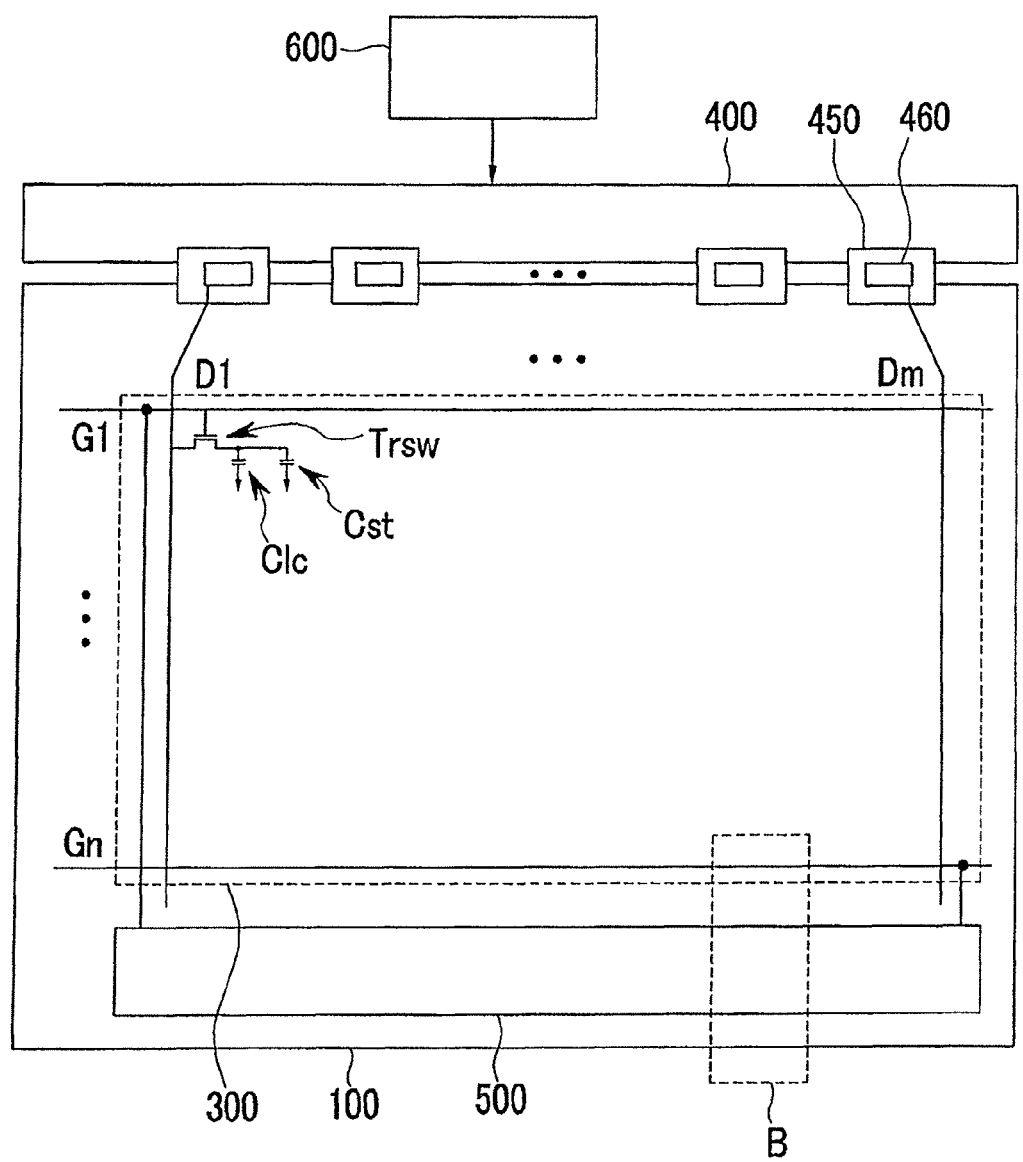
FIG. 4 is a schematic view of a liquid crystal display according to an exemplary embodiment of the present invention.
Figure 5:
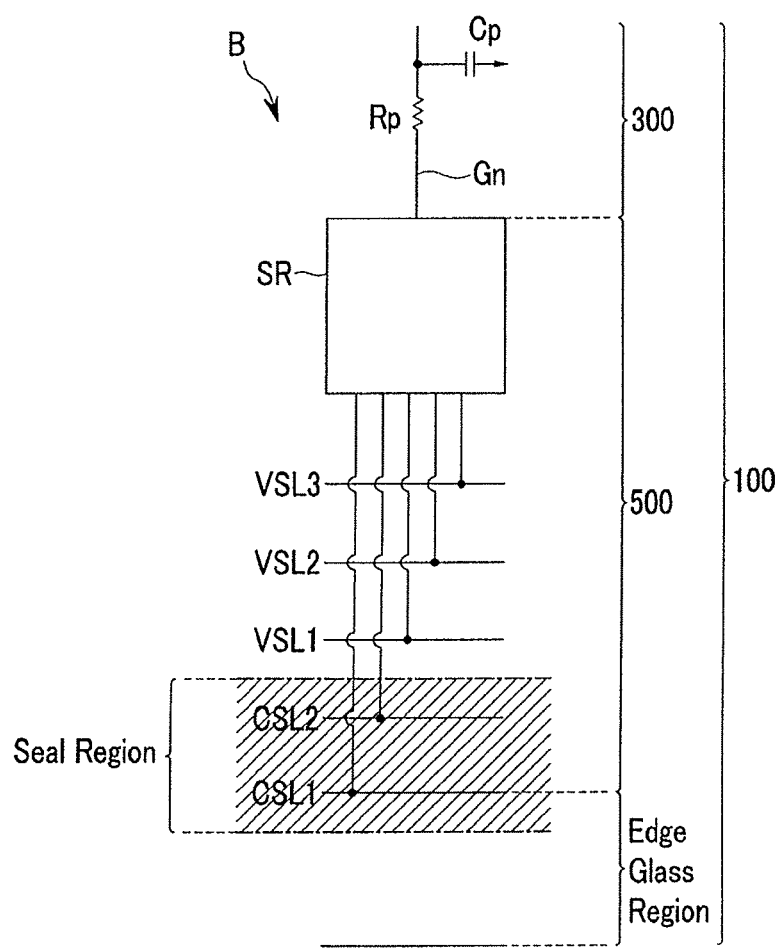
FIG. 5 is an enlarged view of a portion B of the liquid crystal display of FIG. 4 according to an exemplary embodiment of the present invention.

FIG. 4 is a schematic view of a liquid crystal display according to an exemplary embodiment of the present invention, and FIG. 5 is an enlarged view of a portion B of the liquid crystal display of FIG. 4.

The liquid crystal display of FIG. 4 is similar to the display of FIG. 1 discussed with respect to FIG. 2 and FIG. 3 except for the gate driver 500 and the gate lines G1-Gn. For example, the gate driver 500 is disposed at a lower portion of the display area 300 and the gate lines G1-Gn and the gate driver 500 are connected by an additional signal line.

The signal lines include the clock signal lines CSL1 and CSL2 and the voltage signal lines VSL1, VSL2, and VSL3. Among the signal lines, the clock signal lines CSL1 and CSL2 are located furthest away from the stage SR. The signal lines may be integrated with the liquid crystal panel 100. The clock signal lines CSL1 and CSL2 are located between an edge glass region of an outermost edge of the liquid crystal panel 100 and the voltage signal lines VSL1, VSL2, and VSL3. The voltage signal lines VSL1, VSL2, and VSL3 and the stage SR are located between the clock signal lines CSL1 and CSL2 and the display area 300. The clock signal lines CSL1 and CSL2 are located at a distance away from the display area 300 that may reduce coupling of a pixel due to interference between the clock signal lines CSL1 and CSL2 and the display area 300 and reduce an output deviation of the stage SR, thereby improving display quality.

In an embodiment, the clock signal lines CSL1 and CSL2 are located at or near the center of the seal region, and the region where the clock signal lines CSL1 and CSL2 are separated from each other is located within the seal region. Accordingly, distortion of a clock signal waveform output by the clock signal lines CSL1 and CSL2 due to the interference between the clock signal lines CSL1 and CSL2 and sealant may be prevented and a narrow bezel may be designed without increasing a size of the liquid crystal panel 100.

In an embodiment, when the seal region also does not overlap the stage SR, an output deviation of the stage SR due to interference between sealant and the stage SR may be avoided, and a reduction in the aperture ratio of the pattern for the exposure of ultraviolet rays may be avoided.

In an embodiment where the seal region is maintained at about 700 μm ±about 200 μm, the effective width of the seal line is about 300 μm and the clock signal lines CSL1 and CSL2 are disposed within the width of the seal line. The width of the seal region may be changed based on the type of sealant used. For example, the seal region may be larger than about 700 μm according to the type of the sealant. In an embodiment, the seal region is about 1600 μm. A region from the lower boundary of the first clock signal line CSL1 located at the lower side to the upper boundary of the second clock signal line CSL2 located at the upper side may be located within the seal line, and the distance from the lower boundary of the first clock signal line CSL1 located at the lower side to the upper boundary of the second clock signal line CSL2 located at the upper side may be less than about 300 μm. The seal region is a region where the sealant is distributed, and the seal line is located within the seal region. When the width of the seal region is about 700 μm ±about 200 μm, when the effective width of the seal line is larger than about 300 μm, the cost of manufacturing a display may be increased and design of a narrow bezel may be more difficult.

A region where a plurality of clock signal lines are separated from each other may be referred to as a clock signal line region. The width of the clock signal line region may be less than or substantially equal to the width of the seal line, and the clock signal line region may be located within the seal line. The width of the region where a plurality of clock signal lines are located corresponds to the distance from the lower boundary of the clock signal line disposed at the lowest side among a plurality of clock signal lines to the upper boundary of the clock signal line disposed at the upper side among a plurality of clock signal lines.

The gate driver 500 may be located in at least one region of an upper side region, a lower side region, a left side region, or a right side region relative to the display area 300. A plurality of clock signal lines (e.g., CSL1, CSL2) may be located in at least one region of the upper, the lower, the left, or the right regions of the display area 300 that corresponds to the position of the gate driver 500.

Figure 6:
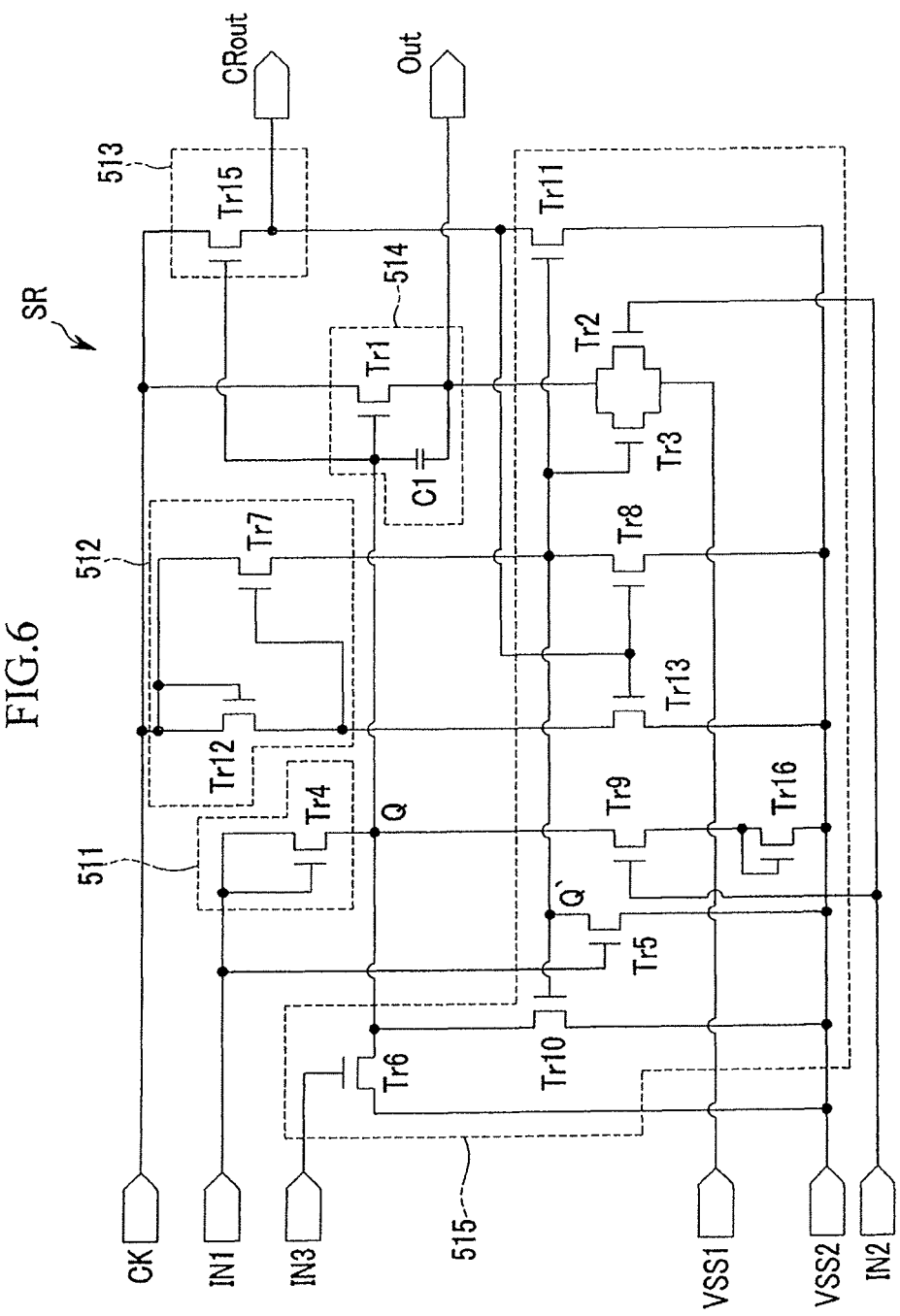
FIG. 6 is a circuit diagram of a stage SR of a gate driver of a liquid crystal display according to an exemplary embodiment of the invention.

FIG. 6 is a circuit diagram of a stage SR of a gate driver 500 according to an exemplary embodiment of the invention. The stage SR of the gate driver 500 is not limited to the circuit diagram of FIG. 6, and may include a circuit that is applied with a single low voltage Vss. Referring to FIG. 6, the stage SR of the gate driver 500 includes an input section 511, a pull-up driver 512, a transmission signal generator 513, an output unit 514, and a pull-down driver 515.

The input section 511 includes a fourth transistor Tr4, and the input section 511 applies a voltage of a high level to a node Q when the first input terminal IN1 is applied with the voltage of the high level.

The pull-up driver 512 includes a seventh transistor Tr7 and a twelfth transistor Tr12. If a signal of a high level is applied at a clock input terminal CK of the pull-up driver 512, the signal of the high level is transmitted to the control terminal of the seventh transistor Tr7 and the pull-down driver 515 through the twelfth transistor Tr12. The signal of the high level transmitted to the control terminal of the seventh transistor Tr7 turns on the seventh transistor Tr7 such that the signal of the high level transmitted from the clock input terminal CK is applied to a node Q'.

The transmission signal generator 513 includes a fifteenth transistor Tr15. The output terminal CRout of the fifteenth transistor Tr15 is connected to the pull-down driver 515, thereby receiving a second low voltage Vss2. Accordingly, the voltage when a transmission signal output by the transmission signal output terminal CRout is a low level is the second low voltage Vss2.

The output unit 514 includes the first transistor Tr1 and the first capacitor C1. The first transistor Tr1 may be referred to as a driving transistor. The output unit 514 outputs the gate voltage according to one among the voltage of the node Q and the clock signal.

The pull-down driver 515 includes the second transistor Tr2, the third transistor Tr3, the fifth transistor Tr5, the sixth transistor Tr6, the eighth transistor Tr8 to the eleventh transistor Tr11, the thirteenth transistor Tr13, and the sixteenth transistor Tr16. The pull-down driver 515 removes charges present within the stage SR to smoothly output the gate-off voltage and the low level voltage of the transmission signal.

The pull-down driver 515 decreases the voltage of the gate voltage output terminal OUT to the first low voltage Vss1, and decreases the voltages of the node Q, the node Q', and the transmission signal output terminal CRout to the second low voltage Vss2 that is lower than the first low voltage Vss1. Therefore, the gate-on voltage and the voltage of the high level of the transmission signal may have substantially the same voltage, and the gate-off voltage and the voltage of the low level of the transmission signal may have different voltages. The gate-off voltage is the first low voltage Vss1, and the low level voltage of the transmission signal is the second low voltage Vss2.

For example, the gate-on voltage may be 25 V, the gate-off voltage and the first low voltage Vss1 may be −5 V, the voltage of the high level of the transmission signal may be 25 V, and the voltage of the low level of the transmission signal and the second low voltage Vss2 may be −10 V.

The transmission signal generator 513 and the output unit 514 are operated by the voltage of the node Q such that the stage SR outputs the high level voltage of the transmission signal and the gate-on voltage. By the transmission signal input through the first input terminal IN1, the second input terminal IN2, and the third input terminal IN3, the transmission signal may be decreased from the voltage of the high level to the second low voltage Vss2, and the gate-on voltage is decreased to the first low voltage Vss1 and then may be the gate-off voltage. The stage SR decreases the voltage of the node Q to the second low voltage Vss2 by the transmission signal, thereby reducing power consumption of the stage SR. Also, the second low voltage Vss2 is lower than the first low voltage Vss1 of the gate-off voltage such that the second low voltage Vss2 may be decreased enough even though the voltage of the transmission signal applied from other stages is changed by a ripple or a noise, and as a result, the leakage current of the transistors included in the stage SR may be reduced such that the power consumption of the stage SR may be reduced.

An exemplary embodiment of the present invention may be used to form a liquid crystal display with a narrow bezel, which may reduce interference between the gate driver, the signal line, and the sealant.

While this invention has been described in connection with exemplary embodiments thereof, it is to be understood that the invention is not limited to the disclosed embodiments, but, on the contrary, is intended to cover various modifications and equivalent arrangements included within the spirit and scope of the disclosure.

What is claimed is:

1. A liquid crystal display comprising:
a substrate;
a gate driver comprising a stage that is disposed on the substrate and is configured to output a gate voltage;
a plurality of signal lines disposed on the substrate and including at least one clock signal line for transmitting a clock signal to the gate driver; and
a sealant disposed on the substrate,
wherein the clock signal line and the sealant overlap each other in a direction perpendicular to a surface of the substrate, and no clock signal line is present between the stage and an edge of the sealant closest to the stage,
wherein the stage is entirely disposed outside the sealant.

2. The liquid crystal display of claim 1, wherein a width of the clock signal line is less than or substantially equal to a width of the sealant.

3. The liquid crystal display of claim 1, wherein the signal lines comprise at least one voltage signal line located between the clock signal line and the stage.

4. The liquid crystal display of claim 3, wherein the at least one voltage signal line are disposed outside the sealant.

5. The liquid crystal display of claim 3, wherein the clock signal line is located between the voltage signal line and an edge glass region located at an outermost edge of the substrate.

6. The liquid crystal display of claim 3, wherein the voltage signal line comprises at least one of a signal line applying a common voltage, a signal line applying a gate-off voltage, or a signal line applying a storage voltage.

7. The liquid crystal display of claim 1, wherein the gate driver is located in an upper side region, a lower side region, a left side region, or a right side region of the substrate.

8. The liquid crystal display of claim 7, wherein the clock signal line is located in the upper side region, the lower side region, the left side region, or the right side region corresponding to a position of the gate driver.

9. The liquid crystal display of claim 1, wherein the clock signal line comprises a first clock signal line and a second clock signal line separated from each other, and a clock signal line region occupied by the first clock signal line and the second clock signal line is located within the sealant.

10. The liquid crystal display of claim 9, wherein a width of the clock signal line region is less than or substantially equal to a width of the sealant.

11. The liquid crystal display of claim 10, wherein the width of the clock signal line region is substantially the same as a sum of a width of the first clock signal line, a width of the second clock signal line, and a distance that the first clock signal line and the second clock signal line are separated from each other.

12. The liquid crystal display of claim 1, wherein the clock signal line is located farther away from the stage than the other signal lines.

13. The liquid crystal display of claim 1, wherein the stage is integrated with the substrate.

14. The liquid crystal display of claim 1, wherein a width of the sealant is less than about 300 µm.

15. The liquid crystal display of claim 1, wherein the signal lines comprise a plurality of voltage signal lines disposed outside the sealant between the stage and the edge of the sealant closest to the stage.

16. A liquid crystal display comprising:
a substrate;
a gate driver comprising a stage that is disposed on the substrate and is configured to output a gate voltage;
a plurality of signal lines transmitting signals to the gate driver, the plurality of signal lines being disposed on the substrate extending in a first direction; and
a sealant disposed on the substrate,
wherein the plurality of signal lines includes a plurality of clock signal lines for transmitting a clock signal to the gate driver, and
all of the clock signal lines which are disposed between an edge of the substrate and the stage in a second direction perpendicular to the first direction are covered by the sealant.

17. The liquid crystal display of claim 16, wherein a width of the clock signal lines is less than or substantially equal to a width of the sealant.

18. The liquid crystal display of claim 17, wherein the clock signal lines comprise a first clock signal line and a second clock signal line separated from each other, and a clock signal line region occupied by the first clock signal line and the second clock signal line is located within the sealant.

19. The liquid crystal display of claim 16, wherein the plurality of signal lines comprise at least one voltage signal line disposed between the clock signal lines and the stage.

20. The liquid crystal display of claim 19, wherein the clock signal lines are disposed between the at least one voltage signal line and the edge of the substrate.

21. The liquid crystal display of claim 19, wherein the at least one voltage signal line comprises at least one of a signal line applying a common voltage, a signal line applying a gate-off voltage, or a signal line applying a storage voltage.

22. The liquid crystal display of claim 16, wherein the gate driver is located in an upper side region, a lower side region, a left side region, or a right side region of the substrate.

23. The liquid crystal display of claim 22, wherein the clock signal lines are located in the upper side region, the low side region, the left side region, or the right side region corresponding to a position of the gate driver.

24. A liquid crystal display comprising:
a substrate;
a gate driver comprising a stage that is disposed on the substrate and is configured to output a gate voltage;
a plurality of signal lines transmitting signals to the gate driver, the plurality of signal lines being disposed on the substrate extending in a first direction; and
a sealant disposed on the substrate,
wherein the plurality of signal lines includes a plurality of clock signal lines for transmitting a clock signal to the gate driver, and
wherein the plurality of clock signal lines and the sealant overlap each other in a direction perpendicular to a surface of the substrate, and no clock signal line is present between the stage and an edge of the sealant closest to the stage and between an edge of the substrate and an edge of the sealant closest to the edge of the substrate in a second direction perpendicular to the first direction.

* * * * *